(12) United States Patent
Lu et al.

(10) Patent No.: US 12,193,213 B2
(45) Date of Patent: Jan. 7, 2025

(54) SEMICONDUCTOR STRUCTURE AND METHOD OF MANUFACTURING SAME

(71) Applicant: CHANGXIN MEMORY TECHNOLOGIES, INC., Anhui (CN)

(72) Inventors: Jingwen Lu, Hefei (CN); Hai-Han Hung, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 444 days.

(21) Appl. No.: 17/411,103

(22) Filed: Aug. 25, 2021

(65) Prior Publication Data

US 2022/0045066 A1 Feb. 10, 2022

Related U.S. Application Data

(63) Continuation of application No. PCT/CN2021/103705, filed on Jun. 30, 2021.

(30) Foreign Application Priority Data

Aug. 5, 2020 (CN) .......................... 202010776933.5

(51) Int. Cl.
  *H10B 12/00* (2023.01)
  *H01L 29/06* (2006.01)
(52) U.S. Cl.
  CPC ....... *H10B 12/312* (2023.02); *H01L 29/0649* (2013.01); *H10B 12/482* (2023.02)
(58) Field of Classification Search
  CPC ........... H01L 29/0649; H01L 27/10845; H01L 27/10885; H01L 27/10814; H10B 12/482; H10B 12/312

(Continued)

(56) References Cited

U.S. PATENT DOCUMENTS 6,331,478 B1 * 12/2001 Lee .................. H01L 21/28114
                                                       257/E21.309
7,153,727 B2    12/2006 Lee
                        (Continued)

FOREIGN PATENT DOCUMENTS

CN          1518112 A     8/2004
CN        102376639 A     3/2012
                        (Continued)

OTHER PUBLICATIONS

Supplementary Partial European Search.Report in the European application No. 21853322.2, mailed on Dec. 18, 2023. 12 pages.

*Primary Examiner* — Douglas W Owens
(74) *Attorney, Agent, or Firm* — Kilpatrick Townsend & Stockton LLP

(57) ABSTRACT

A semiconductor structure and a method of manufacturing the same are provided. The semiconductor structure includes a substrate, bit line structures and isolation walls located on side walls of the bit line structures, and capacitor contact holes. In the substrate, conductive contact regions are arranged. The conductive contact regions are exposed from the substrate. A plurality of discrete bit line structures are located on the substrate. Each of the isolation walls includes at least one isolation layer and a gap between the isolation layer and the bit line structure. Each of the capacitor contact holes is constituted by a region surrounded by the isolation walls between the adjacent bit line structures. The capacitor contact holes expose the conductive contact regions. A top width of the capacitor contact holes is larger than a bottom width thereof in a direction parallel to an arrangement direction of the bit line structures.

6 Claims, 21 Drawing Sheets

(58) Field of Classification Search
USPC .......................................... 257/296; 438/238
See application file for complete search history.

(56) References Cited

U.S. PATENT DOCUMENTS

| | | |
|---|---|---|
| 8,193,088 B2 | 6/2012 | Kim |
| 9,515,022 B2 | 12/2016 | Kwon et al. |
| 10,971,408 B2 | 4/2021 | Yeong et al. |
| 2002/0024093 A1 | 2/2002 | Ahn |
| 2002/0126548 A1* | 9/2002 | Ciavatti ............ H01L 21/76897 |
| | | 257/E21.507 |
| 2004/0140486 A1 | 7/2004 | Lee |
| 2006/0261392 A1 | 11/2006 | Lee |
| 2012/0040527 A1 | 2/2012 | Kim |
| 2016/0276273 A1 | 9/2016 | Kwon et al. |
| 2018/0342521 A1 | 11/2018 | Son |
| 2019/0206873 A1* | 7/2019 | Kim et al. ........ H01L 27/10885 |
| 2020/0135591 A1 | 4/2020 | Yeong et al. |
| 2020/0203354 A1 | 6/2020 | Lee |

FOREIGN PATENT DOCUMENTS

| | | |
|---|---|---|
| CN | 104347345 A | 2/2015 |
| CN | 109390402 A | 2/2019 |
| CN | 109994474 A | 7/2019 |
| CN | 110718532 A | 1/2020 |
| TW | 507321 B | 10/2002 |

* cited by examiner

SEMICONDUCTOR STRUCTURE AND METHOD OF MANUFACTURING SAME

CROSS-REFERENCE TO RELATED APPLICATIONS

The present application is a U.S. continuation application of International Application No. PCT/CN2021/103705, filed on Jun. 30, 2021, which claims priority to Chinese Patent Application No. 202010776933.5, filed on Aug. 5, 2020. International Application No. PCT/CN2021/103705 and Chinese Patent Application No. 202010776933.5 are incorporated herein by reference in their entireties.

TECHNICAL FIELD

Embodiments of the present application relate to a semiconductor structure and a method of manufacturing the same.

BACKGROUND

A transistor and a capacitor of a DRAM are usually interconnected via wires by depositing polycrystalline silicon or metal. With the miniaturization of a semiconductor process, a dimension of a capacitor contact hole interconnecting the transistor and the capacitor of the DRAM is also miniaturized. When a depth-to-width ratio of the capacitor contact hole is relatively high, a void problem tends to occur when filling the capacitor contact holes, which greatly increases the resistance value of the wires.

SUMMARY

In order to solve the above-described problem, an embodiment of the present application provides a semiconductor structure. The semiconductor structure may include a substrate, bit line structures and isolation walls located on side walls of the bit line structures, and capacitor contact holes. In the substrate, conductive contact regions may be provided. The conductive contact regions are exposed from the substrate. A plurality of discrete bit line structures are located on the substrate. Each of the isolation walls includes at least one isolation layer and a gap between the isolation layer and the bit line structure. Each of the capacitor contact holes is constituted by a region surrounded by the isolation walls between the adjacent bit line structures. The capacitor contact holes expose the conductive contact regions. A top width of the capacitor contact holes may be larger than a bottom width thereof in a direction parallel to an arrangement direction of the bit line structures.

According to the embodiments of the present application, an embodiment of the present application provides a method of manufacturing a semiconductor structure. The method may include: providing a substrate in which conductive contact regions are arranged, the conductive contact regions are exposed from the substrate; forming a plurality of discrete bit line structures on the substrate, a top width of the bit line structures is smaller than a bottom width thereof in a direction parallel to an arrangement direction of the bit line structures; forming a sacrificial layer on a side wall of each of the bit line structures and an isolation layer on a side, away from the bit line structure, of the sacrificial layer; and removing the sacrificial layer to form an isolation wall, the isolation wall includes the isolation layer and a gap between the isolation layer and the bit line structure, and a capacitor contact hole is constituted by a region surrounded by the isolation walls between the adjacent bit line structures.

BRIEF DESCRIPTION OF THE DRAWINGS

One or more embodiments are illustrated by way of example with reference to their respective figures in the accompanying drawings, which are not construed as limitations to the embodiments. In the drawings, elements having the same reference numerals represent similar elements. The figures in the accompanying drawings are not to scale unless otherwise indicated.

DETAILED DESCRIPTION

Figure 1:
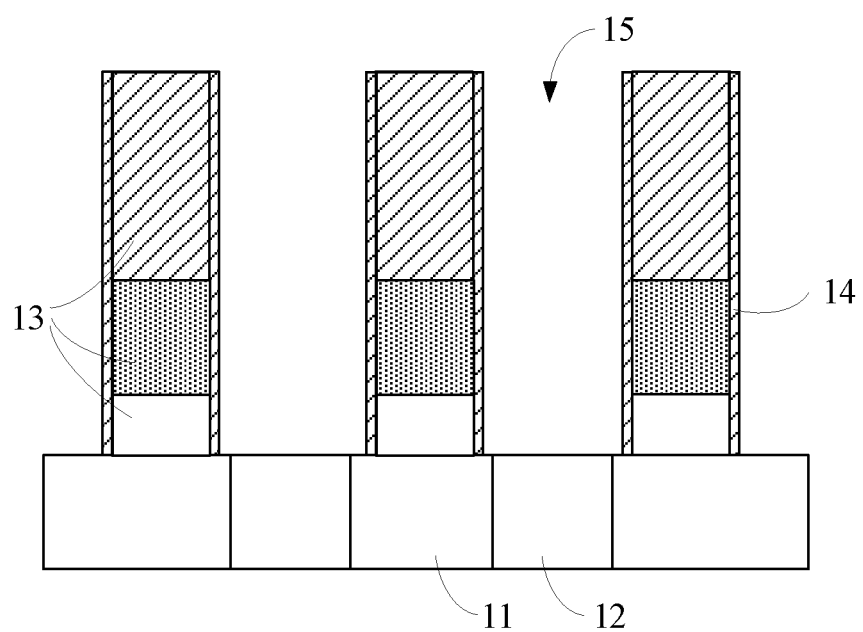
FIG. 1 to FIG. 3 are schematic cross-sectional structure diagrams corresponding to steps of a method of manufacturing a semiconductor structure.

Referring to FIG. 1, a substrate 11, a plurality of discrete bit line structures 13 on the substrate 11, isolation walls 14, and capacitor contact holes 15 are provided. In the substrate 11, conductive contact regions 12 are arranged. The conductive contact regions 12 are exposed from the bit line structures 13. The isolation walls 14 are located on side walls of the bit line structures 13. Each of the capacitor contact holes 15 is constituted by a region surrounded by the isolation walls 14 between the adjacent bit line structures 13. The capacitor contact holes 15 expose the conductive contact regions 12. The capacitor contact holes 15 are to be filled with a conductive material to form conductive plugs.

Figure 2:
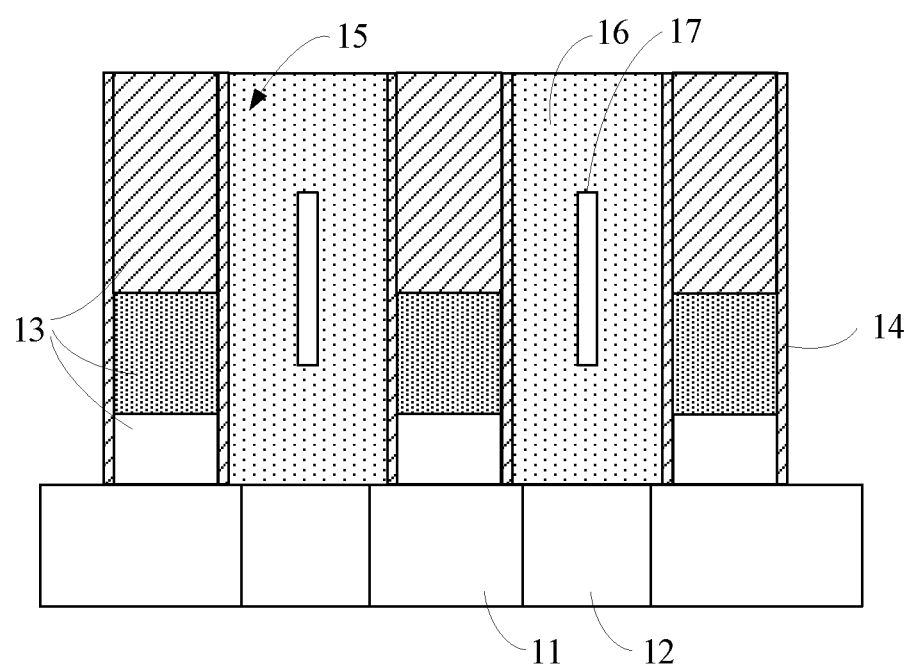

Referring to FIG. 2, the capacitor contact holes 15 are filled with a conductive material to form conductive plugs 16.

Since the isolation wall 14 usually has the same thickness in a direction perpendicular to the side walls of the bit line structures 13, the profile of the capacitor contact holes 15 depends on the profile of the side walls of the bit line structures 13. When a top width of the bit line structures 13 is equal to a bottom width thereof in a direction parallel to an arrangement direction of the bit line structures 13, a top width of the capacitor contact holes 15 is equal to a bottom width thereof.

When a depth-to-width ratio of the capacitor contact holes 15 is large, it is possible that top openings of the capacitor contact holes 15 would be sealed in advance during filling the conductive material, such that the conductive plugs 16 formed thereby may have voids 17. The presence of the voids 17 will increase the resistance value of the conductive plugs 16.

Figure 3:
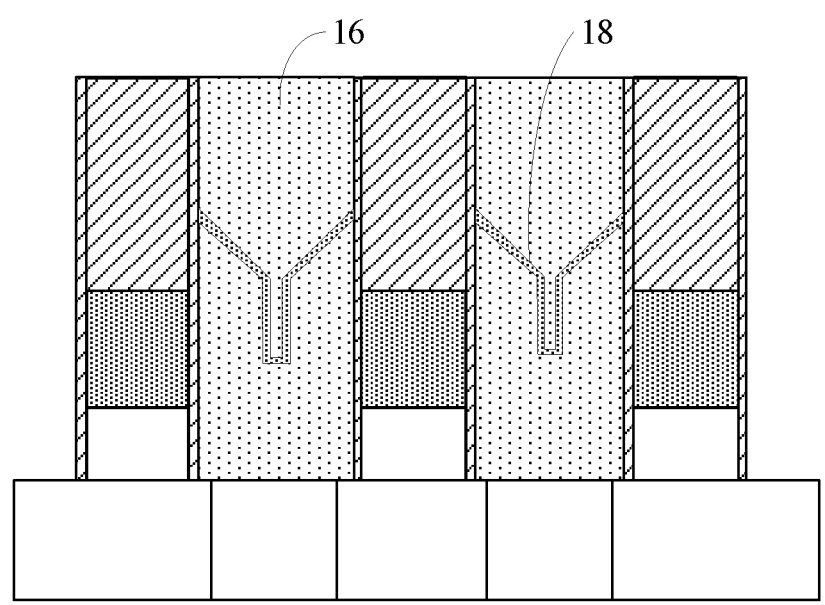

Referring to FIG. 3, the conductive plugs 16 are etched back to expose the voids 17 (referring to FIG. 2). The conductive material is filled again to eliminate the voids 17 and form the conductive plugs 16.

During etching the conductive plugs 16 to expose the voids 17, the conductive material may be oxidized as a result of exposure to oxygen, thereby finally forming a nonconductive oxide layer 18. The presence of the oxide layer 18 also increases the resistance value of the conductive plugs 16, thereby affecting the conductivity of the conductive plugs 16.

In order to solve the above-described problems, the embodiments of the present application provide a semiconductor structure and a method of manufacturing the same. A dielectric constant of an isolation wall is reduced by forming a gap, so that the parasitic capacitance between a conductive plug to be formed subsequently and a bit line structure is reduced. Moreover, a process window of a capacitor contact hole is enlarged by increasing a top width of the capacitor contact hole, so that a top opening of the capacitor contact hole can be prevented from being sealed in advance during depositing a material, and it is ensured that a conductive material can be filled up the capacitor contact holes. In turn, a conductive plug without a void or an oxide layer but with a small resistance value is formed.

In order to clarify the objects, technical solutions, and advantages of the embodiments of the present application more clearly, various embodiments of the present application will be described below with reference to the accompanying drawings. However, those skilled in the art will appreciate that in various embodiments of the present application, numerous technical details are set forth in order that readers can better understand the present application. However, even without these technical details and various changes and modifications based on the following embodiments, the claimed technical solution of the present application may be implemented.

FIG. 4 to FIG. 16 are schematic cross-sectional structure diagrams corresponding to steps of a method of manufacturing a semiconductor structure according to an embodiment of the present application.

Figure 4:
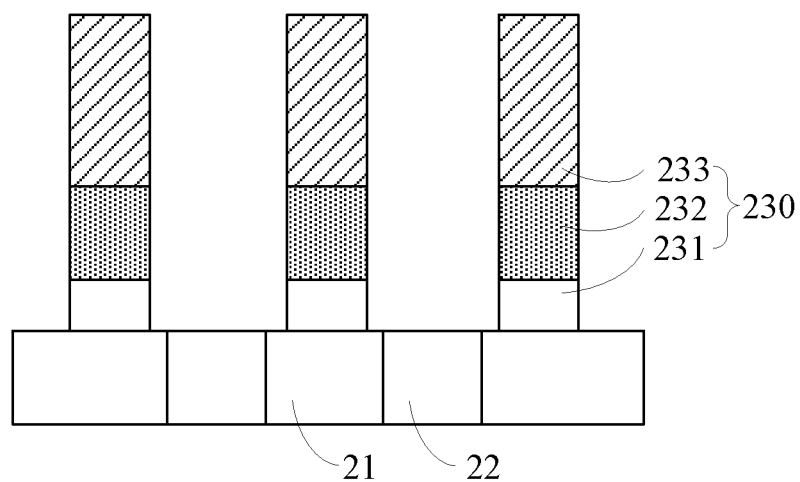
FIG. 4 to FIG. 16 are schematic cross-sectional structure diagrams corresponding to steps of a method of manufacturing a semiconductor structure according to an embodiment of the present application.

Referring to FIG. 4, a substrate 21 is provided. In the substrate 21, conductive contact regions 22 are arranged. The conductive contact regions 22 are exposed from the substrate 21. A plurality of discrete initial bit line structures 230 are formed on the substrate 21. A top width of the initial bit line structures 230 is equal to a bottom width thereof in a direction parallel to an arrangement direction of the initial bit line structures 230.

Each of the initial bit line structures 230 includes a conductive contact layer 231, a metal gate layer 232, and a top dielectric layer 233 arranged in sequence in a direction perpendicular to the substrate 21. A material of the conductive contact layer 231 includes polycrystalline silicon. The metal gate layer 232 includes a titanium nitride-tungsten-titanium nitride stacked structure. A material of the top dielectric layer 233 includes silicon nitride.

In other embodiments, the top width of the initial bit line structures may be larger or smaller than the bottom width thereof.

Figure 5:
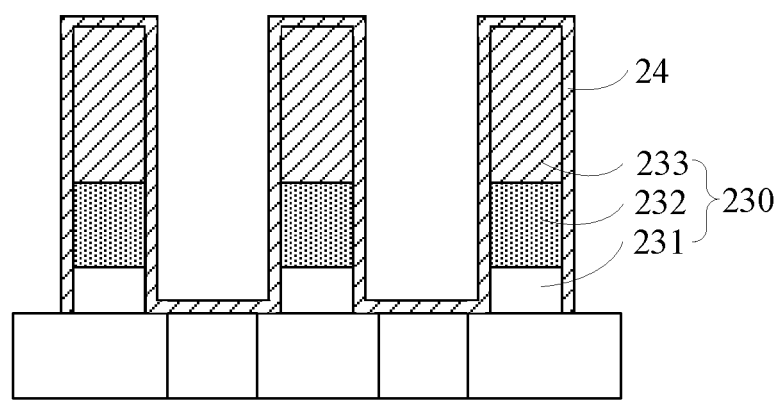

Referring to FIG. 5, a deposition process is performed to form a first isolation layer 24 on a side wall of the initial bit line structure 230.

The first isolation layer 24 is used to protect the metal gate layer 232 in the initial bit line structure 230 for preventing the metal gate layer 232 from being damaged by subsequent processes such as etching or cleaning, so that good conductivity and signal transmission performance of the metal gate layer 232 can be ensured. When the conductive contact layer 231 has a conductive capability, the first isolation layer 24 is also used to protect the conductive contact layer 231, thereby ensuring the conductivity of the initial bit line structure 230.

In the present embodiment, the first isolation layer 24 is separately formed by using a deposition process. Since the first isolation layer 24 needs to play a protection role and a side wall supporting role, the first isolation layer 24 may be formed by using an atomic layer deposition process, so that the first isolation layer 24 has higher compactness and better step coverage.

In the present embodiment, the material of the first isolation layer 24 is the same as the material of the top dielectric layer 233. Thus, in the subsequent etching process, a specific single etching agent may be selected for the material of the first isolation layer 24, so that the etching process has a high etching rate and is favorable for shortening the manufacturing period of the semiconductor structure. In other embodiments, the material of the first isolation layer 24 includes at least one of silicon nitride or silicon oxynitride.

Figure 6:
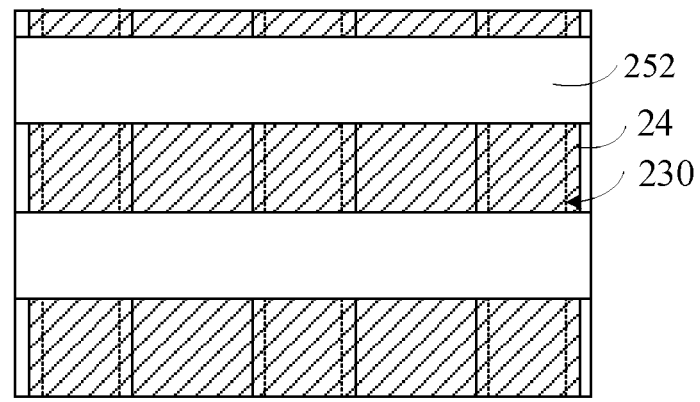

Referring to FIG. 6, a spacer layer 252 is formed. The spacer layer 252 divides a trench between adjacent initial bit line structures 230 into a plurality of discrete grooves. Each of the grooves is used for forming a conductive plug.

Parasitic capacitance may exist between the conductive plugs in the adjacent grooves, and parasitic capacitance may also exist between the conductive plug in a certain groove and the metal gate layer in the initial bit line structure adjacent to the certain groove. The magnitude of the parasitic capacitance is related to the resistance value of the conductive plug. The resistance value of the conductive plug is smaller, the parasitic capacitance is smaller. Moreover, the magnitude of the parasitic capacitance is also related to a dielectric constant of an intermediate isolation material. The dielectric constant is smaller, the parasitic capacitance is smaller.

The resistance value of the conductive plug is related to the bottom area of the conductive plug. The bottom area is larger, the resistance value is smaller. The resistance value of the conductive plug is also related to the structure and material of the conductive plug. The conductive plug has a smaller resistance value when there are fewer or smaller voids and less dielectric material in the conductive plug.

It should be noted that the figures herein are primarily illustrative of adjusting a top structure of the initial bit line structure 230 and forming an isolation wall on the side wall of the initial bit line structure 230. In practice, in the embodiments of the present application, a top structure of the spacer layer 252 is also adjusted accordingly and the isolation wall is further formed on a side wall of the spacer layer 252.

Figure 7:
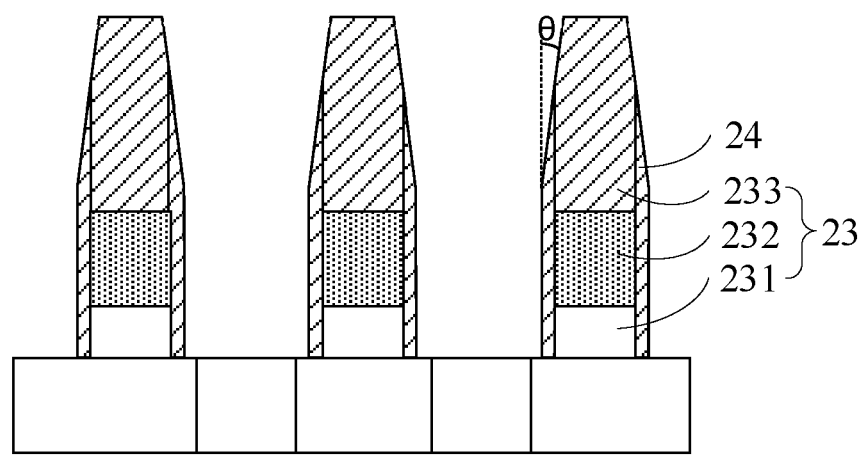

Referring to FIG. 7, a first etching process is performed on the initial bit line structure 230 (referring to FIG. 5) and the first isolation layer 24.

In the present embodiment, after the first isolation layer 24 is formed, the first isolation layer 24 and the initial bit line structure 230 are subjected to a dry etching process having an etching angle to form a bit line structure 23 having a first chamfer θ on the top. An angle of the first chamfer θ is the same as the etching angle. The angle of the first chamfer θ is 5°–35°, e.g. 10°, 15°, 20°, or 30°. In an actual process, an optimal angle of the first chamfer θ is 15°. Forming the first chamfer θ in the above numerical range is favorable for expanding a process window of a capacitor contact hole to be formed subsequently, and thus the capacitor contact hole is prevented from being sealed in advance when a conductive material is deposited. Moreover, specifying an upper limit value of the first chamfer θ is favorable for reducing the process difficulty, preventing the metal gate layer 232 from being damaged by a dry etching process, and ensuring the conductivity of the bit line structure 23.

In the present embodiment, the first etching process removes part of the material at a top corner of the top dielectric layer 233. The top dielectric layer 233 with a changed structure, the metal gate layer 232 and the conductive contact layer 231 together form a new bit line structure 23. Moreover, the first etching process also removes the first isolation layer 24 at the bottom of the groove between the adjacent bit line structures 23 and the first isolation layer 24 on the top of the bit line structure 23.

In the present embodiment, a dry etching process is performed by using a mixed plasma of three gases $SF_6$, $CF_4$, and $O_2$. Residual gases are purged by using an inert gas (e.g. argon).

Figure 8:
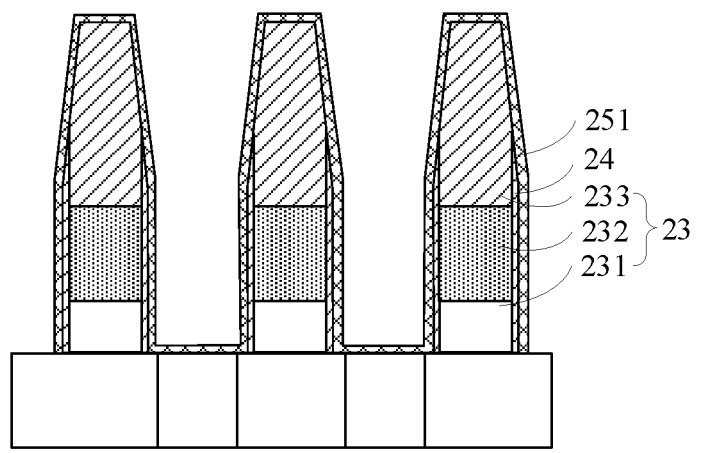

Referring to FIG. 8, a deposition process is performed to form a sacrificial film 251.

In the present embodiment, a material of the sacrificial film 251 includes silicon oxide. The sacrificial film 251 may be formed by an atomic layer deposition process. Specifically, silicon oxide may be formed by reacting LTO 250 with oxygen or N zero with oxygen.

When the material of the sacrificial film 251 is selected, an etching selection ratio of the material of the sacrificial film 251 to the material of the first isolation layer 24 needs to be considered, so that the first isolation layer 24 is prevented from being etched through during subsequently etching the sacrificial film 251, and thus the metal gate layer 232 is prevented from being damaged.

Figure 9:
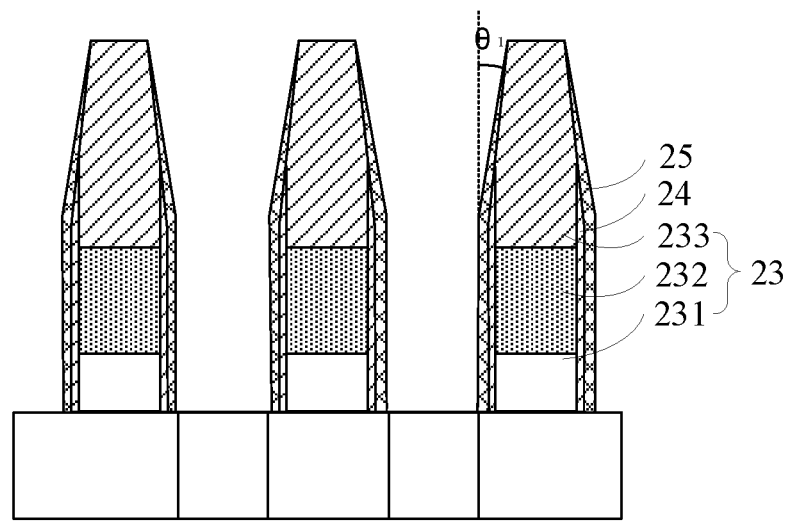

Referring to FIG. 9, a second etching process is performed to etch the sacrificial film 251 (referring to FIG. 8) to form the sacrificial layer 25.

In the present embodiment, the second etching process etches and removes the sacrificial film 251 located on the top of the bit line structure 23, removes the sacrificial film 251 located at the bottom of the groove between the adjacent bit line structures 23, and removes part of the sacrificial film 251 located on the side wall of the bit line structure 23. The remained sacrificial film 251 is used as the sacrificial layer 25. The sacrificial film 25 has a second chamfer θ1 which is larger than the first chamfer θ. Thus, the process window of the capacitor contact hole to be formed subsequently is further increased.

It should be noted that removing the sacrificial film 251 located at the bottom of the groove between the adjacent bit line structures 23 is favorable for preventing a second isolation film to be formed subsequently from covering the sacrificial film 251, thereby ensuring that the second isolation film at the bottom will not collapse due to lack of support. Moreover, it is favorable for preventing a gap formed by etching the sacrificial film 251 from being exposed when the second isolation layer at the bottom is removed, so that the conductive material for forming the conductive plug is prevented from entering the gap, thereby ensuring that the isolation wall to be formed finally has a lower dielectric constant.

In the present embodiment, the etching angle and the etching agent type of the second etching process may be adjusted relative to those of the first etching process so as to form a new etching chamfer and improve the etching rate.

Figure 10:
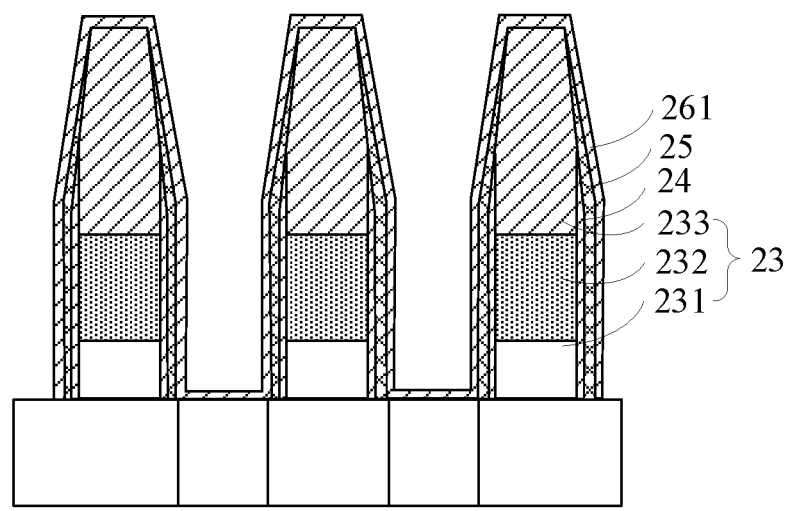

Referring to FIG. 10, a deposition process is performed to form a second isolation film 261.

In the present embodiment, the material of the second isolation film 261 may be the same as that of the first isolation layer 24. The material of the second isolation film 261 includes silicon nitride or silicon oxynitride. Thus, when the sacrificial layer 25 is subsequently etched by using an etching agent, it is only necessary to consider an etching selection ratio of the material of the sacrificial layer 25 to the material of the first isolation layer 24. As a result, the etching agent may favorably be selected from a broader scope.

Figure 11:
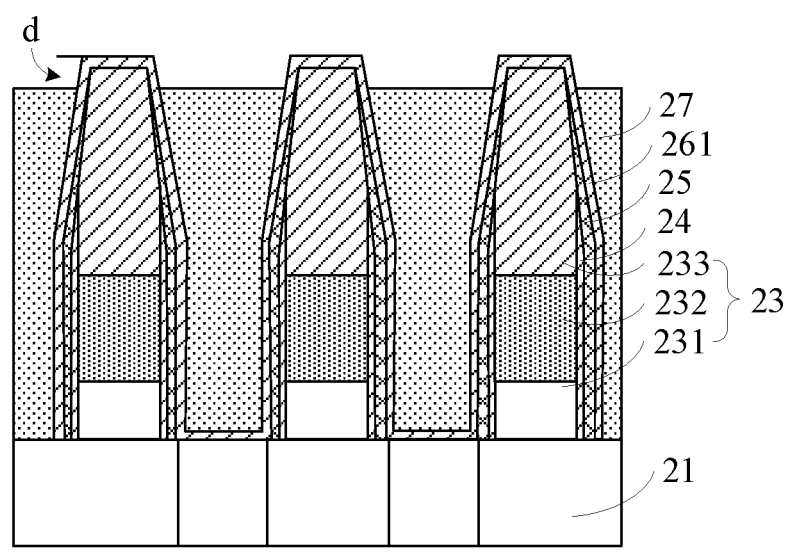

Referring to FIG. 11, a support material is deposited and etched back to form a support structure 27 that exposes the second isolation film 261.

In the present embodiment, there is a height difference d between a top surface of the support structure 27 and a top surface of the second isolation film 261 in a direction perpendicular to the surface of the substrate 21. The magnitude of the height difference d determines the position of the second isolation film 261 that is subsequently removable by etching and the area of the sacrificial layer 25 exposed after etching the second isolation film 261. The exposed area of the sacrificial layer 25 is larger, the contact area between the sacrificial layer 25 and the etching agent is larger, and the etching rate of the sacrificial layer 25 is higher. Moreover, the exposed area of the sacrificial layer 25 is larger, the width of a top opening of the gap to be sealed subsequently is larger, and the sealing is more difficult.

In the present embodiment, the height difference d has a value ranging from 3 nm-20 nm, e.g., 5 nm, 10 nm or 15 nm. In an actual process, the height difference d preferably has a value of 10 nm. Thus, a high etching rate of the sacrificial layer 25 can be ensured, the sealing material is prevented from falling into the gap to be formed subsequently, and the gap is ensured to have a low dielectric constant.

In the present embodiment, the support structure 27 is used for supporting the second isolation film 261, thereby preventing the second isolation film 261 from collapsing due to lack of support after the sacrificial layer 25 is etched and removed, and ensuring that the isolation wall can be successfully formed. The material of the support structure 27 includes a photoresist.

Figure 12:
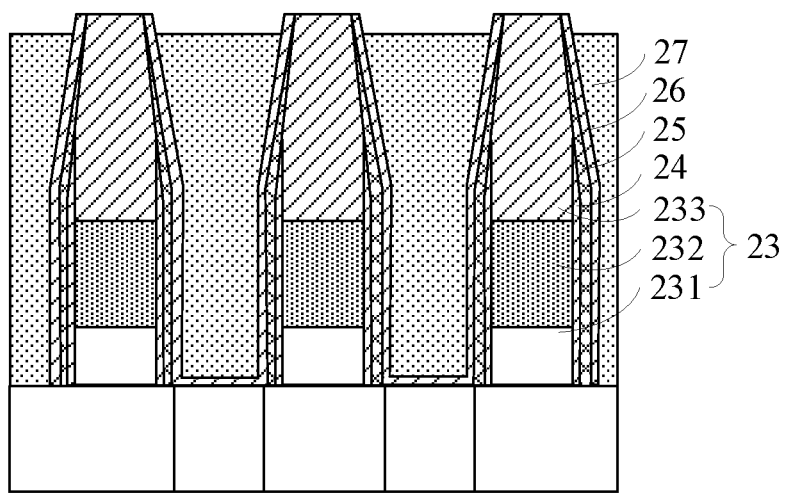

Referring to FIG. 12, a second isolation film 261 (referring to FIG. 11) on the top of the bit line structure 23 is etched to expose the sacrificial layer 25 and form a second isolation layer 26.

The position of the second isolation film 261 to be removed may be adjusted according to practical requirements. In other embodiments, the second isolation film exposed by the support structure may also be removed.

Figure 13:
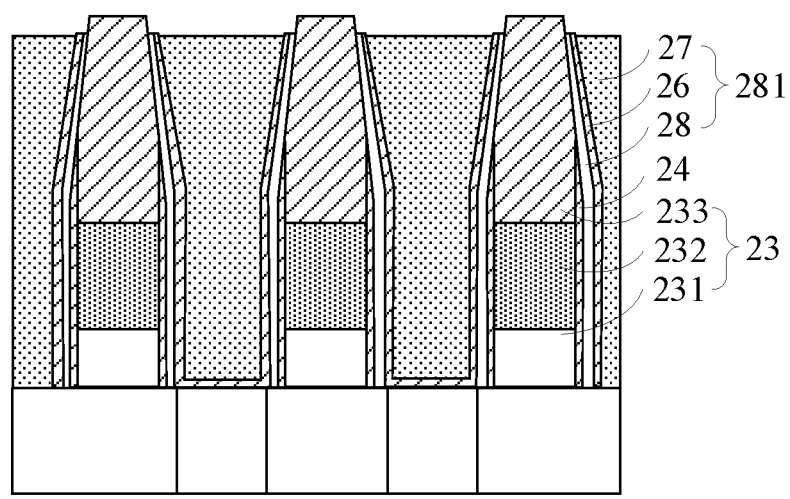

Referring to FIG. 13, the sacrificial layer 25 (referring to FIG. 12) is etched to form a gap 28. The gap 28, the first isolation layer 24 and the second isolation layer 26 on either side of the gap 28 together form an isolation wall 281.

In the present embodiment, in a direction parallel to the arrangement direction of the bit line structures 23, a dielectric material (nitride) of the isolation wall 281 in contact with the structures which are adjacent to the isolation wall 281 (e.g. the bit line structure 23, the conductive plug, and the spacer layer 252) has a high hardness, plays a side wall supporting role, and is favorable for preventing the structure of the isolation wall 281 from being damaged by an external stress. A dielectric material between the first isolation layer 24 and the second isolation layer 26 is air which has a low dielectric constant, so that the isolation wall 281 is favorably allowed to have a low dielectric constant. As a result, the parasitic capacitance between the bit line structure 23 and the conductive plug is reduced.

It should be noted that the second isolation layer 26 is also etched, during the etching of the sacrificial layer 25 to form the gap 28. The degree of etching of the second isolation layer 26 is related to an etching selection ratio of the material of the second isolation layer 26 to the material of the sacrificial layer 25. The etching selection ratio is smaller, the degree of etching of the second isolation layer 26 is higher. A top surface height of the etched second isolation layer 26 may be higher than, or flush with, or lower than that of the support structure 27.

Figure 14:
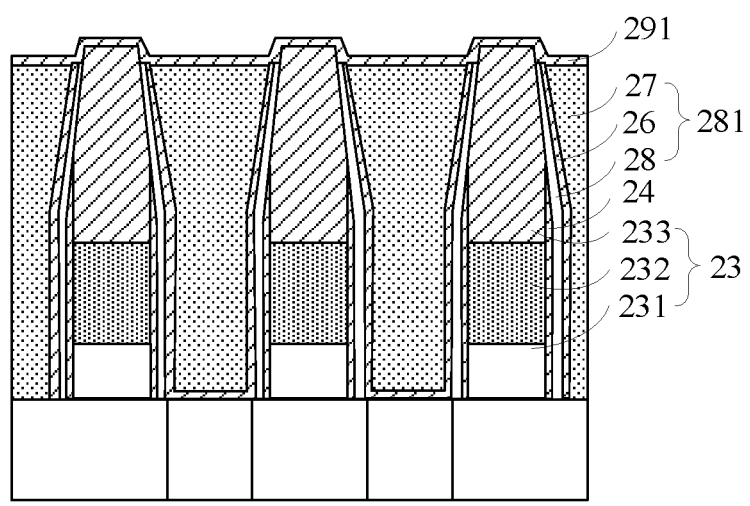

Referring to FIG. 14, a sealing film 291 is formed. The sealing film 291 seals the top opening of the gap 28 and further covers the surface of the support structure 27.

In the present embodiment, the sealing film 291 is formed before the support structure 27 is removed. This is favorable for preventing process by-products from entering the gap 28 during a subsequent ashing process. In this way, it is ensured that the gap 28 and the isolation wall 281 have low dielectric constants.

In the present embodiment, the material of the sealing film 291 may be the same as the material of the second isolation layer 26. By performing the sealing with the same material as the second isolation layer 26, the problems of subsequent collapse of the sealing film 291 and the like can be avoided, since the connection strength between the same materials is large. The process of forming the sealing film 291 includes a low pressure chemical vapor deposition process.

In other embodiments, the sealing film may be formed after the support structure is removed. In this way, the sealing film and the second isolation layer between the support structure and the substrate can be continuously etched by the same etching agent subsequently. This is favorable for improving the etching rate and shortening the process time. Moreover, the material of the sealing film may be different from the material of the second isolation layer.

Figure 15:
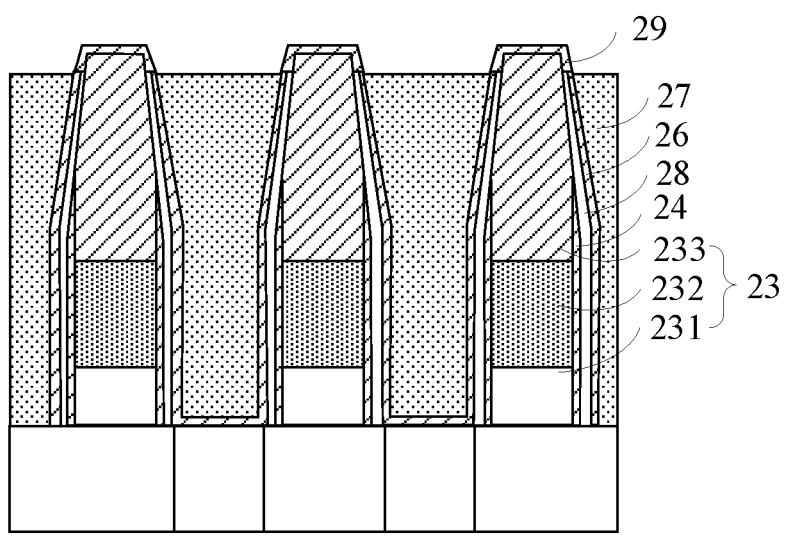
Figure 16:
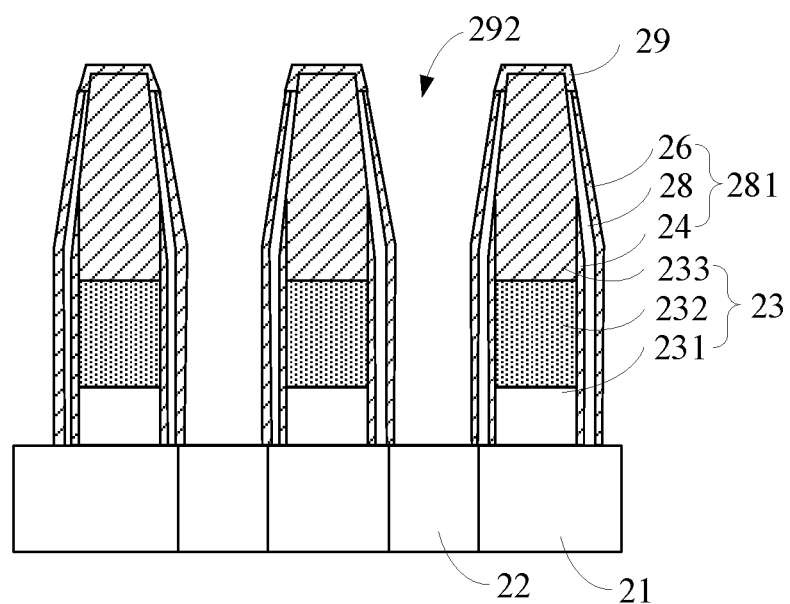

Referring to FIG. 15, the sealing film 291 on the support structure 27 is etched. The remained sealing film 291 is used as a sealing layer 29 which seals the top opening of the gap 28. Referring to FIG. 16, the support structure 27 is removed by using a wet etching process (referring to FIG. 15). Further, the second isolation layer 26 at the bottom of the groove between the adjacent bit line structures 23 is etched to expose the conductive contact region 22. A capacitor contact hole 292 having a top width larger than a bottom width is formed.

In the present embodiment, since the top width of the capacitor contact hole 292 is larger than the bottom width thereof, it is favorable for preventing the capacitor contact hole 292 from being sealed in advance in the process of forming the conductive plug by filling the capacitor contact hole 292 with the conductive material. As a result, it is ensured that the conductive material can fill up the capacitor contact hole 292 to form the conductive plug with a small resistance value.

In the present embodiment, the isolation wall containing a gap is formed. The arrangement of the gap is favorable for reducing a dielectric constant of the isolation wall. As a result, the parasitic capacitance between the conductive plug filled in the capacitor contact hole and the bit line structures adjacent to the conductive plug is reduced. Moreover, a top width of the capacitor contact hole is larger than a bottom width of the capacitor contact hole. This is favorable for ensuring that the capacitor contact hole can be filled up by the conductive material when the capacitor contact hole is filled with the conductive material to form the conductive plug. As a result, the presence of voids is avoided, and the conductive plug is ensured to have a small resistance value.

Another embodiment of the present application provides a method of manufacturing a semiconductor structure. Unlike the previous embodiment, in the present embodiment, a sacrificial layer and a second isolation layer are formed by using an ion doping process. Reference will now be made in detail to FIG. 17-FIG. 20. FIG. 17 to FIG. 20 are schematic structure diagrams corresponding to steps of a method of manufacturing a semiconductor structure according to another embodiment of the present application. The parts which are same as or corresponding to those of the previous embodiment may be referred to the corresponding description of the previous embodiment, and will not be repeated hereinbelow.

Figure 17:
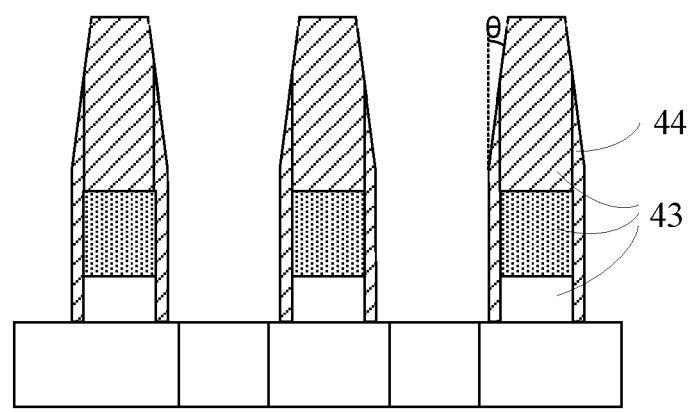
FIG. 17 to FIG. 20 are schematic cross-sectional structure diagrams corresponding to steps of a method of manufacturing a semiconductor structure according to another embodiment of the present application.
Figure 18:
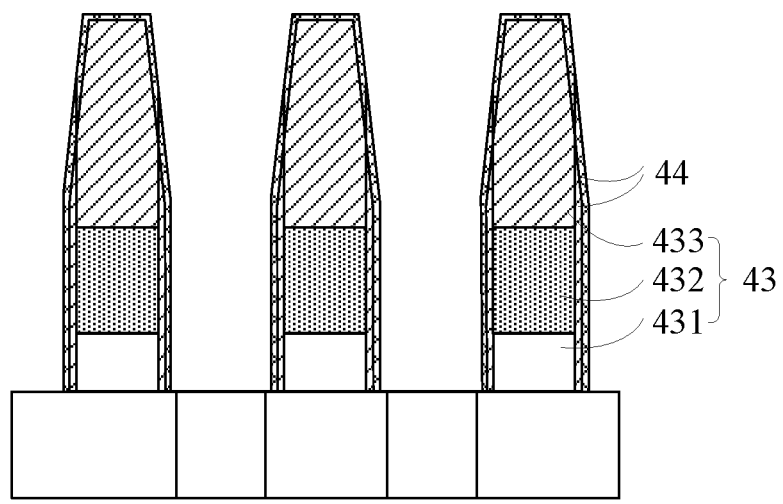

Referring to FIG. 17 and FIG. 18, a first isolation layer 44 is formed, and the first isolation layer 44 is subjected to a first ion doping process.

In the present embodiment, the first isolation layer 44 includes a first isolation portion close to the bit line structure 43 and a second isolation portion away from the bit line structure 43. The second isolation portion is ion-doped such that a dielectric constant of the second isolation portion of the first isolation layer 44 is smaller than a dielectric constant of the first isolation portion. Thus, the hardness of the first isolation portion can be maintained, such that the first isolation portion not only has a superior side wall supporting effect, but also allows the isolation wall have a low dielectric constant without adding an additional film layer. Moreover, only the second isolation portion is subjected to the ion doping process. This is favorable for preventing the metal gate layer 432 from being damaged by the ion doping process and ensuring that the metal gate layer 432 has good conductivity.

In the present embodiment, not only the second isolation portion of the first isolation layer 44, but also the top dielectric layer 433 exposed from the first isolation layer 44 is subjected to the first ion doping process. Thus, when the first ion doping process is performed, only the energy of doping ions needs to be controlled to control the doping depth, and the doping position does not need to be defined. This is favorable for reducing the doping difficulty.

In the present embodiment, the material of the first isolation layer 44 includes silicon nitride. The second isolation portion of the first isolation layer 24 is doped with oxygen ions by the first ion doping process. The material of the doped second isolation portion includes silicon oxynitride. The silicon oxynitride layer has a lower dielectric constant relative to the silicon nitride layer.

In the present embodiment, silicon nitride is ion-doped by an oxygen plasma with oxygen or ozone as an oxygen source. A radio frequency power for forming the oxygen plasma may be 600 W-2000 W, e.g. 800 W, 1200 W, or 1600 W. A temperature of the oxygen plasma may be 800° C.-1000° C., e.g. 850° C., 900° C., or 950° C.

Figure 19:
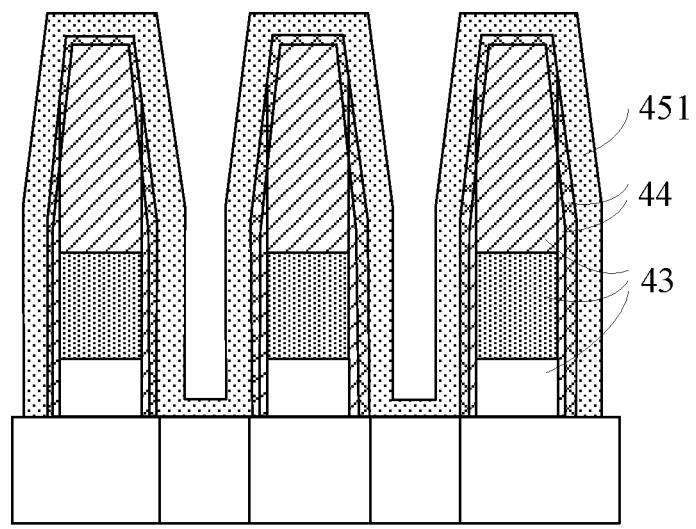

Referring to FIG. 19, a sacrificial film 451 is formed on a side of the first isolation layer 44 away from the bit line structure 43.

In the present embodiment, a material of the sacrificial film 451 includes silicon oxide. The sacrificial film 451 may be formed by an atomic layer deposition process. Specifically, silicon oxide may be formed by reacting LTO 250 with oxygen or N zero with oxygen.

In the present embodiment, the sacrificial film 451 at the bottom of the groove between the adjacent bit line structures 43 may be removed after the sacrificial film 451 is formed, thereby reducing removal difficulty.

Figure 20:
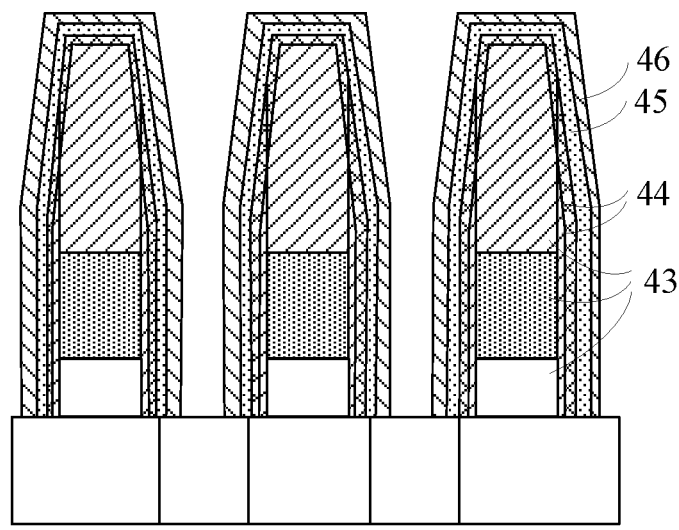

Referring to FIG. 20, a second isolation portion of a sacrificial film 451 (referring to FIG. 19) is subjected to a second ion doping process to form a sacrificial layer 45 and a second isolation layer 46. The sacrificial layer 45 is the remained sacrificial film 451.

In the present embodiment, the sacrificial film 451 includes a first isolation portion close to the bit line structure 43 and a second isolation portion away from the bit line structure 43. The second isolation portion of the sacrificial film 451 is ion-doped, such that the hardness of the second isolation portion of the sacrificial film 451 is larger than that of the first isolation portion thereof.

Thus, the second isolation portion of the sacrificial film 451 has higher side wall supporting capacity, without providing additional film layers. This is favorable for preventing the structure of the isolation wall from being damaged by stress from the structures adjacent to the isolation wall. Moreover, since the nature of the material of the second isolation portion is changed by the doping ions, when the material of the sacrificial film 451 is subsequently etched, only the first isolation portion of the sacrificial film 351 is etched and removed, and the second isolation portion with the doping ions may be remained as the second isolation layer 46 and may play a side wall supporting role.

Specifically, the material of the sacrificial film 451 includes silicon oxide. The second isolation portion of the sacrificial film 451 is doped with nitrogen ions by the second ion doping process. The material of the doped second isolation portion includes silicon nitride and/or silicon oxynitride. Relative to silicon oxide, silicon nitride and silicon oxynitride have higher hardness, may play a side wall supporting role. This is favorable for ensuring the high structural stability of the isolation wall.

In the present embodiment, silicon oxide is ion-doped by a nitrogen plasma with nitrogen or ammonia as a nitrogen source. A radio frequency power for forming the nitrogen plasma may be 600 W-2000 W, e.g. 800 W, 1200 W, or 1600 W. A temperature of the nitrogen plasma may be 600° C.-800° C., e.g. 650° C., 700° C., or 750° C.

Since the thermal shock resistance of silicon oxide is weaker than that of silicon nitride, ion doping with a lower plasma temperature is favorable for avoiding damage such as stress concentration, fracture, and surface layer peeling of the second isolation layer 46 caused by a larger thermal shock, and ensuring high structural stability of the isolation wall.

After the sacrificial layer 45 and the second isolation layer 46 are formed, the second isolation layer 46 on the top of the bit line structure 43 is etched and removed to expose the sacrificial layer 45. After the sacrificial layer 45 is exposed, the sacrificial layer 45 is etched to form a gap. The gap, the first isolation layer 44 and the second isolation layer 46 together form the isolation wall.

In the present embodiment, the second isolation portion of the first isolation layer is subjected to the ion doping process and the sacrificial film is subjected to the ion doping process. The doping ions change the nature of the original material of the isolation layer, so that the dielectric constant of the isolation wall is reduced without providing an additional film layer. Moreover, since it is not necessary to provide the additional film layer, it is favorable for avoiding the side wall profile problem occurring when a plurality of dielectric layers are formed. It is favorable for reducing the thickness of the isolation wall and leaving more room for the capacitor contact hole. As a result, the capacitor contact hole has a larger bottom area, and the conductive plug filled in the capacitor contact hole is ensured to have a small resistance value.

It should be noted that in the actual process steps, one deposition process and one etching process are required to be performed in order to form each dielectric layer. Multiple depositions and multiple etching may cause the side wall profile of the dielectric layers to change, and the preset performance requirements cannot be met. Moreover, in the process of forming the dielectric layers, each dielectric layer has a corresponding minimum thickness due to the limitation of the forming process. Furthermore, since the spacing between adjacent bit line structures is constant, the number of the dielectric layers is smaller, the bottom area of the capacitor contact hole for forming the conductive plug is larger, and the resistance value of the conductive plug to be formed subsequently is smaller.

Correspondingly, an embodiment of the present application provides a semiconductor structure which may be manufactured by the method of manufacturing the semiconductor structure described in the above.

Figure 21:
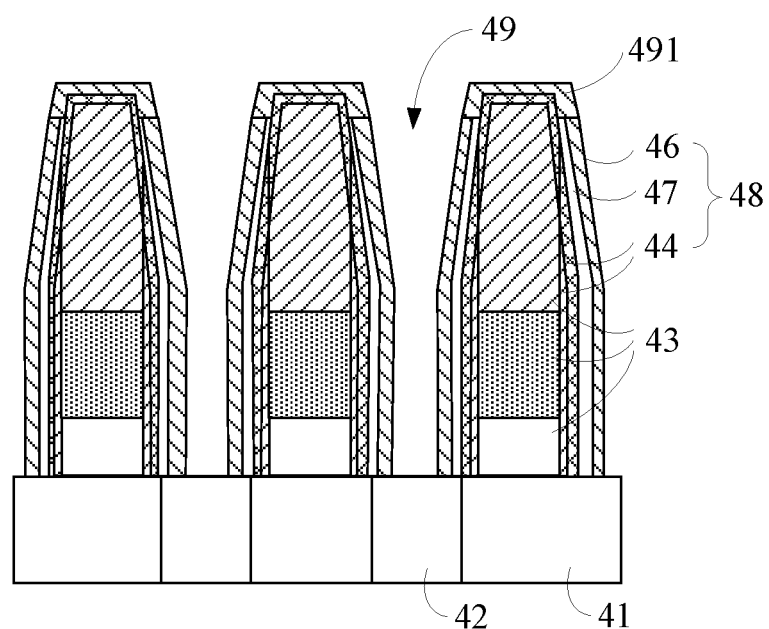
FIG. 21 is a schematic cross-sectional structure diagram of a semiconductor structure according to an embodiment of the present application.

Referring to FIG. 21, the semiconductor structure includes a substrate 41, bit line structures 43 and isolation walls 48 located on side walls of the bit line structures 43, and capacitor contact holes 49. In the substrate 41, conductive contact regions 42 are arranged. The conductive contact regions 42 are exposed from the substrate 41. A plurality of discrete bit line structures 43 are located on the substrate 41. Each of the isolation walls 48 includes at least one isolation layer and a gap 47 between the isolation layer and the bit line structure 43. Each of the capacitor contact holes 49 is constituted by a region surrounded by the isolation walls 48 between the adjacent bit line structures 43. The capacitor contact holes 49 expose the conductive contact regions 42. A top width of the capacitor contact holes 49 is larger than a bottom width thereof in a direction parallel to an arrangement direction of the bit line structures 43.

In the present embodiment, doping ions are provided in at least one of the isolation layers. The hardness of the isolation layer with the doping ions is larger than that of the isolation layer without the doping ions, or a dielectric constant of the isolation layer with the doping ions is smaller than that of the isolation layer without the doping ions.

Specifically, the isolation wall 48 includes a first isolation layer 44, a second isolation layer 46, and a gap 47 between the first isolation layer 44 and the second isolation layer 46. The second isolation layer 46 away from the bit line structure 43 has doping ions therein. The thickness of the second isolation layer 46 is smaller than that of the first isolation layer 44 in a direction parallel to the arrangement direction of the bit line structures 43.

The material of the first isolation layer 44 includes silicon nitride. A second isolation portion of the first isolation layer 44 is doped with oxygen ions. The dielectric constant of the oxygen-doped silicon nitride is smaller than that of the silicon nitride. The material of the second isolation layer 46 includes silicon oxide. The second isolation layer 46 is doped with nitrogen ions. The hardness of the nitrogen-doped silicon oxide is larger than that of the silicon oxide.

In the present embodiment, a sealing layer 491 is provided on a top of the bit line structure 43. The sealing layer 491 is connected to the bit line structure 43 and the second isolation layer 46. The sealing layer 491 is used for sealing the top of the gap 47. In a direction perpendicular to the surface of the substrate 41, a top surface height of the second isolation layer 46 is lower than that of the bit line structure 43.

In the present embodiment, the bit line structure 43 has a chamfer on the top. The chamfer may be 5°-35°, e.g. 10°, 15°, 20°, or 30°.

In the present embodiment, the isolation wall includes the gap between the isolation layer and the bit line structure. The arrangement of the gap is favorable for reducing a dielectric constant of the isolation wall, so that the parasitic capacitance between a conductive plug filled in a capacitor contact hole and the bit line structures adjacent to the conductive plug is reduced. Moreover, a top width of the capacitor contact hole is larger than a bottom width of the capacitor contact hole, so that the capacitor contact hole can be filled up by a conductive material when the capacitor contact hole is filled with the conductive material to form the conductive plug. As a result, the void problem is avoided, and the conductive plug is ensured to have a small resistance value.

It will be appreciated by those skilled in the art that the various implementations described above are specific embodiments for implementing the present application. However, various changes in form and details may be made in practice without departing from the spirit and scope of the present application. Any person skilled in the art can make various changes and modifications without departing from the spirit and scope of the present application. Therefore, the scope of protection of the present application should be determined by the scope of the claims.

The invention claimed is:

1. A semiconductor structure, comprising:
a substrate, in which conductive contact regions are arranged, wherein the conductive contact regions are exposed from the substrate;
bit line structures and isolation walls located on side walls of the bit line structures, wherein a plurality of the bit line structures are discretely located on the substrate, and each of the isolation walls comprises at least one isolation layer and a gap between the at least one isolation layer and a corresponding one of the bit line structures; and
capacitor contact holes, each of which is constituted by a region surrounded by the isolation walls between adjacent bit line structures of the bit line structures, wherein the capacitor contact holes expose the conductive contact regions, and a top width of the capacitor contact holes is larger than a bottom width of the capacitor contact holes in a direction parallel to an arrangement direction of the bit line structures; and,
wherein each of the bit line structures has a first chamfer θ on a top thereof, and the first chamfer θ is 5°-35°; and each of the gaps has a second chamfer $\theta_1$ on a top thereof, and the second chamfer $\theta_1$ is larger than the first chamfer θ.

2. The semiconductor structure of claim 1, wherein the at least one isolation layer is at least two isolation layers, at least one of the at least two isolation layers has doping ions, a hardness of the at least one of the at least two isolation layers with the doping ions is larger than that of the isolation layer without the doping ions, or a dielectric constant of the at least one of the at least two isolation layers with the doping ions is smaller than that of the isolation layer without the doping ions.

3. The semiconductor structure of claim 2, wherein the at least one of the at least two isolation layers comprises a silicon nitride layer and the doping ions comprise oxygen ions; or, the at least one of the at least two isolation layers comprises a silicon oxide layer and the doping ions comprise nitrogen ions.

4. The semiconductor structure of claim 2, wherein each of the isolation walls comprises two isolation layers and the gap between the two isolation layers, a first isolation layer of the two isolation layers away from the bit line structure has the doping ions, and a thickness of the first isolation layer away from the bit line structure is smaller than that of a second isolation layer of the two isolation layers close to the bit line structure in the direction parallel to the arrangement direction of the bit line structures.

5. The semiconductor structure of claim 1, wherein each of the isolation walls comprises a first isolation layer, the gap, and a second isolation layer arranged in sequence, a material of the first isolation layer comprises at least one of silicon nitride or silicon oxynitride, and a material of the second isolation layer comprises at least one of silicon nitride or silicon oxynitride.

6. The semiconductor structure of claim 1, further comprising: a sealing layer, which is connected to the corresponding one of the bit line structures and the at least one isolation layer, and is configured to seal a top of the gap, wherein a top surface height of the at least one isolation layer connected to the sealing layer is lower than that of the corresponding one of the bit line structures in a direction perpendicular to a surface of the substrate.

\* \* \* \* \*